US012120865B2

(12) United States Patent
Huang et al.

(10) Patent No.: US 12,120,865 B2
(45) Date of Patent: Oct. 15, 2024

(54) ARRAYS OF DOUBLE-SIDED DRAM CELLS INCLUDING CAPACITORS ON THE FRONTSIDE AND BACKSIDE OF A STACKED TRANSISTOR STRUCTURE

(71) Applicant: Intel Corporation, Santa Clara, CA (US)

(72) Inventors: Cheng-Ying Huang, Hillsboro, OR (US); Ashish Agrawal, Hillsboro, OR (US); Gilbert Dewey, Beaverton, OR (US); Abhishek A. Sharma, Hillsboro, OR (US); Wilfred Gomes, Portland, OR (US); Jack Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 782 days.

(21) Appl. No.: 17/132,981

(22) Filed: Dec. 23, 2020

(65) Prior Publication Data

US 2022/0199624 A1 Jun. 23, 2022

(51) Int. Cl.
*H10B 12/00* (2023.01)
*H01L 21/683* (2006.01)
(Continued)

(52) U.S. Cl.
CPC ......... *H10B 12/30* (2023.02); *H01L 21/6835* (2013.01); *H01L 29/0673* (2013.01); *H01L 29/42392* (2013.01); *H01L 29/66742* (2013.01); *H01L 29/78618* (2013.01); *H01L 29/78696* (2013.01); *H10B 12/03* (2023.02);
(Continued)

(58) Field of Classification Search
CPC ........ H10B 12/30; H10B 12/03; H10B 12/05; H10B 53/30; H10B 12/09; H10B 12/315; H10B 12/33; H01L 21/6835; H01L 29/0673; H01L 29/42392; H01L 29/66742;
(Continued)

(56) References Cited

U.S. PATENT DOCUMENTS 10,090,193 B1 * 10/2018 Chanemougame .......................... H01L 21/823821
2005/0280061 A1 12/2005 Lee
(Continued)

OTHER PUBLICATIONS

Extended European Search Report from European Patent Application No. 21197336.7 notified Mar. 17, 2022, 11 pgs.

*Primary Examiner* — Herve-Louis Y Assouman
(74) *Attorney, Agent, or Firm* — Essential Patents Group, LLP

(57) ABSTRACT

Monolithic two-dimensional (2D) arrays of double-sided DRAM cells including a frontside bit cell over a backside bit cell. Each double-sided cell includes a stacked transistor structure having at least a first transistor over a second transistor. Each double-sided cell further includes a first capacitor on a frontside of the stacked transistor structure and electrically coupled to a source/drain of the first transistor. Each double-sided cell further includes a second capacitor on a backside of the stacked transistor structure and electrically coupled to a source/drain of the second transistor. Frontside cell addressing interconnects are electrically coupled to other terminals of at least the first transistor while one or more backside addressing interconnects are electrically coupled to at least one terminal of the second transistor or second capacitor.

20 Claims, 11 Drawing Sheets

(51) Int. Cl.
  *H01L 29/06*  (2006.01)
  *H01L 29/423*  (2006.01)
  *H01L 29/66*  (2006.01)
  *H01L 29/786*  (2006.01)
  *H10B 53/30*  (2023.01)

(52) U.S. Cl.
  CPC ............ *H10B 12/05* (2023.02); *H10B 53/30* (2023.02); *H01L 2221/68363* (2013.01)

(58) Field of Classification Search
  CPC ......... H01L 29/78618; H01L 29/78696; H01L 2221/68363
  See application file for complete search history.

(56) References Cited

U.S. PATENT DOCUMENTS

| | | | |
|---|---|---|---|
| 2011/0143506 A1* | 6/2011 | Lee | H01L 28/91 438/238 |
| 2011/0260225 A1 | 10/2011 | Lee | |
| 2012/0003808 A1 | 1/2012 | Lee | |
| 2017/0271341 A1 | 9/2017 | Tanaka et al. | |
| 2018/0061835 A1 | 3/2018 | Yang et al. | |
| 2020/0279850 A1* | 9/2020 | Sharma | G11C 7/1078 |
| 2021/0358842 A1* | 11/2021 | Huang | H01L 23/5329 |

* cited by examiner

ARRAYS OF DOUBLE-SIDED DRAM CELLS INCLUDING CAPACITORS ON THE FRONTSIDE AND BACKSIDE OF A STACKED TRANSISTOR STRUCTURE

BACKGROUND

Demand for higher performance integrated circuits (ICs) in electronic device applications has motivated increasingly dense transistor architectures. Stacked gate-all-around (GAA) transistor structures, such as ribbon or wire (RoW) transistor structures, include a plurality of channel regions that are in a vertical stack with one transistor channel over another.

While stacked transistor structures may improve transistor density for advanced logic circuits, memory with high density (gigabytes/mm$^2$) and high communication bandwidth at lower cost is critical to overcome the memory wall problem of a Von Neumann machine. A two-dimensional (2-D) memory chip can only improve to a point without a significant change of memory array architecture. Three-dimensional (3-D) IC die stacking has recently become a popular approach to further increasing memory density. For example, more than eight DRAM IC dies can be stacked in some high bandwidth memory (HBM) technology.

IC die stacking technology may be applied to any DRAM IC comprising a 2D array of bit cells, each bit cell including an access transistor and a capacitor (1T-1C). However, assuming a 1T-1C bit cell area has nearly reached a fundamental limit due to elevated leakage and physical space limitations, further scaling will be relegated to die stacking, unless, for example, stacked RoW structures could be leveraged to make a fundamental change in DRAM bit cell architecture.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
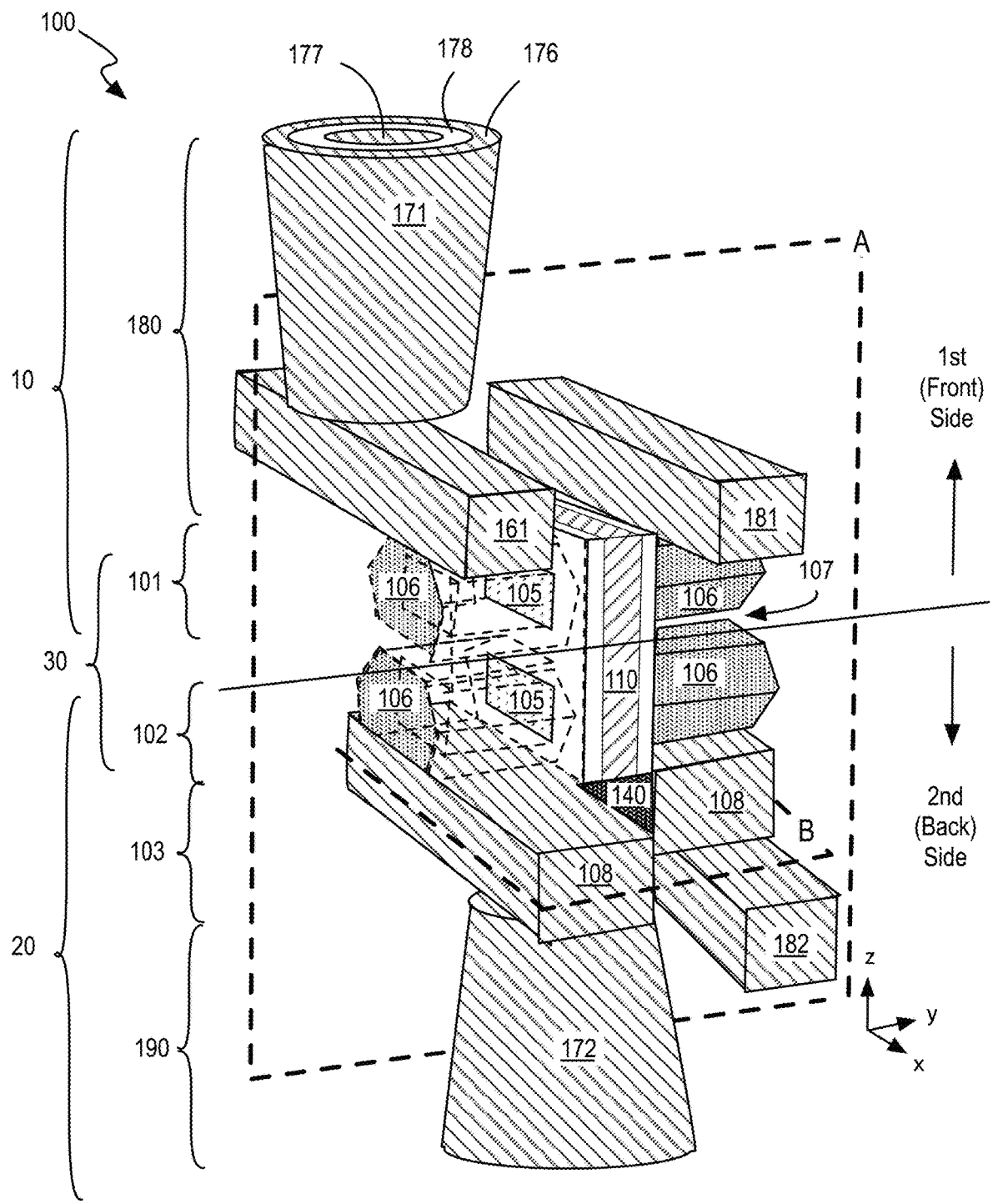
FIG. 1 illustrates an isometric sectional view of a double-sided DRAM cell including a transistor stack between frontside and backside capacitors, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct physical contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

As described further below, two-dimensional (2D) arrays of double-sided DRAM cells including a frontside bit cell over a backside bit cell may be fabricated into an integrated circuit (IC). Since the 2D array over a surface of the IC has two sides, the double-sided DRAM described herein may also be considered a three-dimensional (3D) array of DRAM bit cells since there is a vertical stack of two bit cells within the footprint, or area, of one bit cell. However, since the double-sided DRAM described herein is fabricated within a single IC die, the array is referred to as "monolithic" in contrast to multi-tiered DRAM arrays comprising a stacked assembly of separate IC die. The 2D arrays of double-sided DRAM cells described herein may be embedded within an IC die that further includes logic circuitry. Such eDRAM may double the density of HBM accessible to the on-chip logic circuitry. Multiple IC die including 2D arrays of double-sided DRAM cells described herein may also be stacked into a 3D memory devices comprising multiple tiers of double-sided DRAM cells to have double bit cell density/die relative to assemblies of conventional IC die having 2D arrays of single-sided, single-bit cells.

Each double-sided DRAM cell includes a stacked transistor structure having at least a first transistor over a second transistor. A first capacitor on a frontside of the stacked transistor structure is electrically coupled to a source/drain of the first transistor, and a second capacitor on a backside of the stacked transistor structure is electrically coupled to a source/drain of the second transistor. Frontside cell addressing interconnects may be electrically coupled to other terminals of at least the first transistor while one or more backside addressing interconnects may be electrically coupled to at least one terminal of the second transistor or of the second capacitor.

Fabrication of double-sided, or "double-layered" stacked memory may leverage monolithic stacked transistor structures that include GAA, stacked RoW channels, which are also suitable for advanced logic (CMOS) circuitry. Stacked transistor structures suitable for advanced CMOS may be further leveraged in double-sided DRAM architectures through the application of backside transistor interconnect technology. For example, the backside transistor contact technology described in any of International Applications PCT/US2015/052033, PCT/US2015/052288, PCT/US2015/052440 (all commonly assigned) may be applied to stacked RoW transistor structures. Likewise, the double-sided fabrication techniques and device structures described in International Application PCT/US2017/048752 (commonly assigned) may be applied to fabricate on the backside of a workpiece device structures typically fabricated only the frontside of a workpiece, such as the interconnects and MIM capacitors of an addressable array of DRAM cells.

FIG. 1 illustrates an isometric sectional view of a double-sided DRAM cell structure 100, which includes a frontside bit cell 10 in a stack over a backside bit cell 20. Frontside bit cell 10 includes a frontside access transistor 101, and backside bit cell 20 includes a backside access transistor 102. Transistors 101 and 102 are two transistors of a RoW transistor stack structure 30, which is between frontside metallization levels 180 and backside metallization levels 190. Frontside metallization levels 180 include a frontside metal-insulator-metal capacitor 171, and backside metallization levels 190 include a backside metal-insulator-metal capacitor 172.

As further illustrated, transistor stack structure 30 has a GAA transistor architecture with a plurality of stacked channel regions 105. Transistor stack structure 30 is illustrated as including two channel regions 105. Hence, upper transistor 101 includes a first (upper) channel 105 while lower transistor 102 includes a second (lower) channel 105. Although two channel regions 105 are illustrated, a transistor stack structure may include any integer number n of channel regions, with advantageous embodiments having 2n channel regions so that there are n upper channel regions and n lower channel regions.

In some embodiments, channel regions 105 are crystalline semiconductor. Although crystalline semiconductor includes polycrystalline thin film material, the crystalline semiconductor may be advantageously monocrystalline. In some such embodiments, channel regions 105 have cubic crystallinity with the top surfaces of each of each channel regions 105 having crystallographic orientation of (100), (111), or (110), for example. Other crystallographic orientations are also possible. In some embodiments, channel regions 105 are a substantially monocrystalline group IV semiconductor material, such as, but not limited to substantially pure silicon (e.g., having only trace impurities), silicon alloys (e.g., SiGe), or substantially pure germanium (e.g., having only trace impurities) Channel regions 105 may also have any of these same exemplary compositions in alternative polycrystalline or amorphous embodiments, for example where transistor stack structure 30 is fabricated from a thin film semiconductor material layer. Polycrystalline or amorphous embodiments of channel regions 105 may also include semiconducting metal oxides, such as IGZO. Although channel regions 105 are illustrated as having a substantially homogenous composition, they may alternatively comprise one or more semiconductor heterojunctions that, for example further include a first semiconductor material adjacent to a second semiconductor material.

Transistor stack structure 30 may comprise transistors of either positive or negative conductivity type Channel regions 105 may each be lightly-doped or intrinsic portions of either a P-type or N-type transistor. Upper transistor 101 includes a first (upper) pair of source and drain regions 106, which are electrically coupled together through an upper one of channel regions 105. Lower transistor 102 includes a second (lower) pair of source and drain regions 106, which are electrically coupled together through a lower one of channel regions 105. In exemplary embodiments, the pairs of source and drain regions 106 are all doped to a same conductivity type (e.g., N-type). Notably, transistors 101 and 102 may be independently operative because there is an electrically insulative space 107 between the stack of source and drain regions 106. Although illustrated as a void for sake of clarity, insulative space 107 may comprise any dielectric material spacing apart source and drain regions 106 within stacked transistor structure 30.

Source and drain regions 106 may comprise any semiconductor material suitable for a transistor. In some embodiments, source/drain semiconductor regions 106 include impurity-doped portions of semiconductor material protruding laterally beyond channel regions 105 as denoted by dashed lines in FIG. 1. Source/drain regions 106 may be comprise one or more electrically active impurities. In some embodiments, for example, source/drain regions 106 are a Group IV semiconductor material (e.g., Si, Ge, or SiGe alloy) with at least one of a p-type impurity (e.g., boron or gallium) or an n-type impurity (e.g., phosphorus, arsenic, or antimony). In the illustrated example, source and drain regions 106 comprise faceted epitaxial material that has been grown, for example laterally from an end portion of channel regions 105, and/or from source/drain RoW ends (depicted in dashed line) cantilevered from channel regions 105. Source and drain regions 106 need not be single crystalline material, in which case the facets shown in FIG. 1 may not be present.

In the exemplary embodiment illustrated in FIG. 1, transistors 101 and 102 share a common gate electrode 110 facilitating control of both channel regions 105 by one frontside interconnect (not depicted in FIG. 1), which in the context of a DRAM array may contact multiple cells in a row or column, for example as a wordline. Although gate electrode 110 is shared, stacked channel regions 105 are electrically isolated from each other, for example by gate dielectric (not depicted).

As further illustrated in FIG. 1, the stack of channel regions 105 are over a sub-channel region 140, which may have been part of a workpiece substrate (e.g., a large format semiconductor wafer). Sub-channel region 140 may vary depending on the implementation of stacked transistors 30 as well as implementation of backside bit cell 20. Sub-channel region 140 is under the stack of channel regions 105, under gate electrode 110, and may be a base of a fin, for example, from which channel regions 105 were formed. As such, sub-channel region 140 may have a composition and/or microstructure similar to channel regions 105. For example, in some embodiments where channel regions 105 are of a Group IV material (e.g., silicon), sub-channel region 140 is also a Group IV material (e.g., silicon). In some further embodiments where channel regions 105 are substantially monocrystalline, sub-channel region 140 is also substantially monocrystalline, and has the same crystallinity and/or crystal orientation as that of channel regions 105. In other embodiments, for example where channel regions 105 were formed from a semiconductor layer of an semiconductor-on-insulator (SOI) substrate, sub-channel region 140 is a buried silicon dioxide layer (BOx). Hence, although sub-channel region 140 has sufficiently high electrical resistivity, the chemical composition of sub-channel region 140 may vary as a function of the starting substrate material.

Frontside capacitor 171 includes a first capacitor terminal 176 separated from a second metal capacitor terminal 177 by an insulator 178. Capacitor terminals 176, 177 may have any composition of suitable electrical conductivity, such as but not limited to, metals. Exemplary metals include copper, tungsten, molybdenum, ruthenium, aluminum, titanium, and alloys including one or more of these metals. In some embodiments, insulator 178 is a dielectric, such as but not limited to, silicon dioxide, silicon nitride, silicon oxynitride, metal oxides comprising oxygen and a metal such as hafnium, aluminum, zirconium, yttrium, etc. In alternative embodiments, insulator 178 is a ferroelectric, such as, but not limited to, a perovskite with some examples being $BaTiO_3$, $SrTiO_3$, $BaSrTiO_3$. Although not visible in the view of FIG. 1, backside capacitor 172 similarly includes a MIM stack with a first capacitor terminal separated from a second capacitor terminal by an intervening insulator. In exemplary embodiments, frontside capacitor 171 and backside capacitor 172 have substantially the same architecture to achieve substantially the same capacitance. Although the geometry of capacitors 171 and 172 may vary with implementation, in the illustrated embodiment capacitors 171 and 172 are cylindrical structures with a radius (x-y plane) of the cylindrical structures being, for example, 20-40 nm, and a height (z-dimension) of the cylindrical structures being, for example, 100-500 nm.

Frontside capacitor 171, and more specifically capacitor terminal 176, is electrically coupled to one of the source and drain regions 106 for upper transistor 101. In this example, capacitor terminal 176 is coupled to a drain of transistor 101 through a frontside drain contact 161. A frontside (source) contact 161 may electrically couple the other of the source and drain regions 106 of upper transistor 101 to a frontside cell addressing interconnect, such as a frontside bitline (not depicted). A first capacitor terminal of backside capacitor 172 is electrically coupled to one of the source and drain regions 106 for lower transistor 102. In this example, one backside capacitor terminal is coupled to a drain of transistor 102 through a first backside source/drain contact 108. A second backside source/drain contact 108 may electrically couple the other of the source and drain regions 106 for lower transistor 102 to a backside cell addressing interconnect, such as a backside bitline 182.

In FIG. 1, a plane A drawn in dashed line passes through a transverse width of gate electrode(s) 110, and through a longitudinal length of channel regions 105. Plane A is bifurcated by a solid line along spacing 107, which demarks a functional boundary between frontside cell 10, and backside cell 20. Notably, however, the entirety of stacked transistor structure 30 is on a front side of sub-channel region 140. Sub-channel region 140 is a structural (physical) marker of a reference plane B also drawn in dashed line that is within the x-y plane and passes through a substrate 103. Hence, from FIG. 1 it should be clear that transistor stack structure 30 has been fabricated from a front side of substrate plane B, for example according one or more GAA RoW transistor fabrication techniques. Backside fabrication may then be limited to forming backside metallization levels 190, which include backside capacitor 172 and any backside cell addressing interconnects (e.g., backside bitline 182).

Figure 2A:
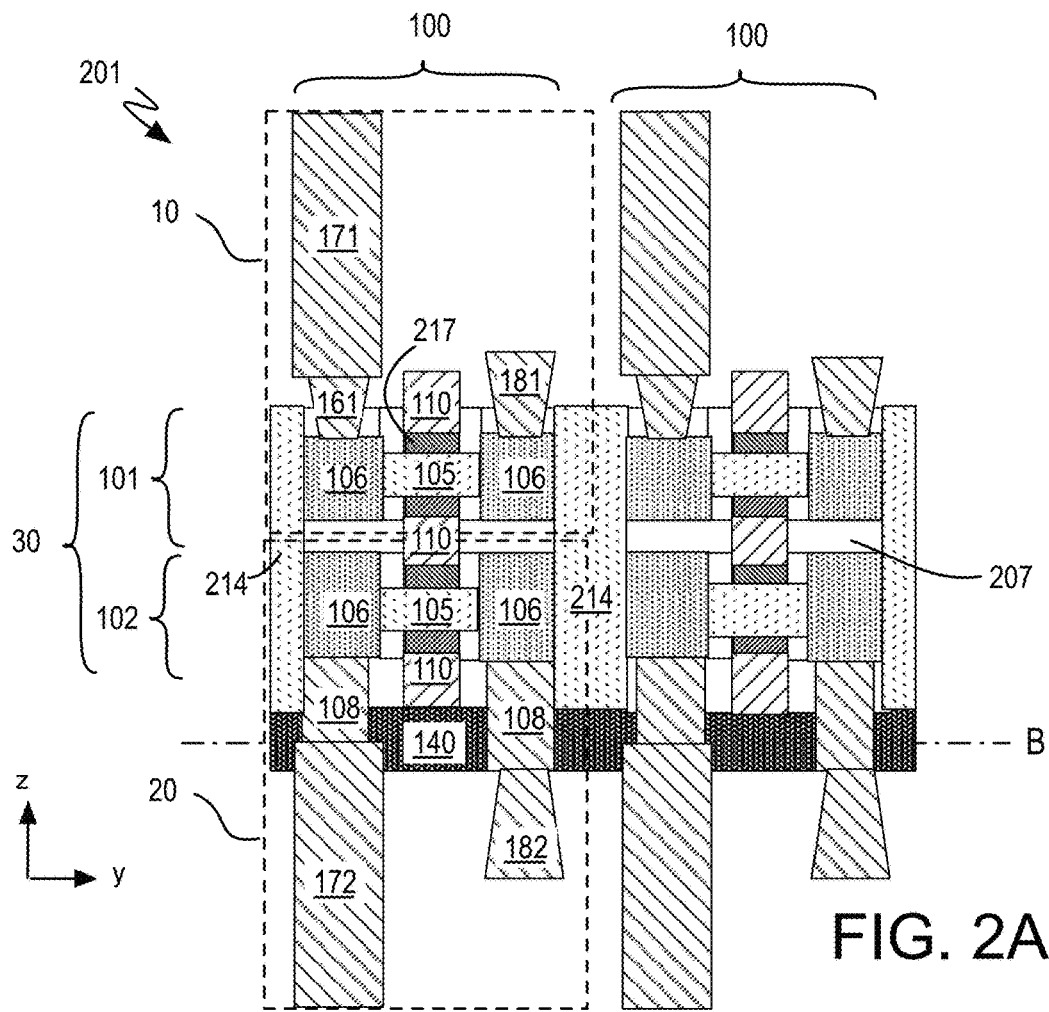
FIG. 2A illustrates a cross-sectional view of a memory array including the double-sided DRAM cell structure introduced in FIG. 1, and an adjacent double-sided cell, in accordance with some embodiments.
Figure 2B:
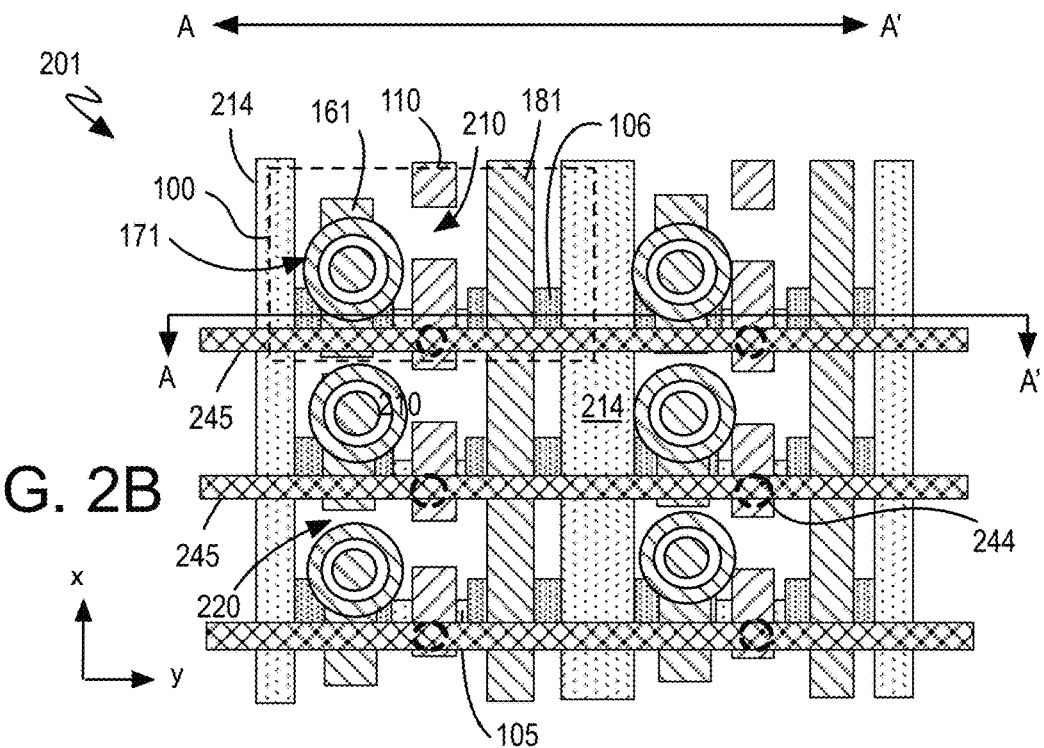
FIG. 2B illustrates a top-down plan view of the memory array shown in FIG. 2A, in accordance with some embodiments.

FIG. 2A illustrates a cross-sectional view of a DRAM array 201 that includes double-sided cell structure 100 adjacent to another double-sided cell structure 100 within the A plane introduced in FIG. 1. FIG. 2B illustrates a top-down plan view of memory array 201, in accordance with some embodiments.

Referring first to FIG. 2A, within double-sided cell structure 100, frontside bit cell 10 is outlined with a first dashed line box, and backside bit cell 20 is outlined by a second dashed line box. Double-sided cell structure 100 is laterally adjacent to a second, substantially identical, double-sided cell structure 100. FIG. 2A further illustrates a dielectric material 207 spacing apart the pair of source and drain regions 106 of upper transistor 101 from the pair of source and drain regions 106 of lower transistor 101. A dielectric material 214 electrically isolates one source and drain stack from and adjacent source and drain stack.

Gate electrode 110 wraps around both channel regions 105 with a gate dielectric 217 spacing gate electrode 110 apart from each of the channel regions 105. For clarity, gate electrode 110 is depicted as a single homogeneous metal but it may include multiple compositionally distinct metals. In some embodiments, gate electrode 110 comprises an n-type work function metal having a work function between about 3.9 eV and about 4.2 eV, for example. Suitable n-type work function metals include, but are not limited to, hafnium, zirconium, titanium, tantalum, aluminum, and metal carbides that include these elements (e.g., titanium carbide, zirconium carbide, tantalum carbide, hafnium carbide and aluminum carbide). In some other embodiments, gate electrode 110 includes a p-type work function metal having a work function between about 4.9 eV and about 5.2 eV, for example. Suitable p-type materials include, but are not limited to, ruthenium, palladium, platinum, cobalt, nickel titanium, tungsten, conductive metal nitrides (e.g., TiN, WN), and conductive metal oxides (e.g., ruthenium oxide). In still other embodiments, gate electrode 110 may instead include a mid-gap work function metal having a work function between those of the n-type and p-type work function metals (e.g., 4.2-4.9 eV). Although not illustrated in FIG. 2A, a compositionally distinct gate fill metal may be over the work function metal where a thickness of the work function metal does not fully occupy the volume allocated to gate electrode 110.

Gate dielectric 217 completely surrounds channel regions 105. Gate dielectric 217 may, for example, include a high-k dielectric material layer that has a bulk relative permittivity greater than 8. Gate dielectric 217 may also include a thermal (chemical) oxide layer. In some embodiments where channel regions 105 are substantially pure silicon, the thermal oxide layer comprises predominantly silicon and oxygen. A high-k gate dielectric layer may have any composition known to be suitable as a transistor gate dielectric and that has a bulk relative permittivity greater than 8. One exemplary high-k material is metal oxide ($MO_x$). Examples include a metal oxide comprising predominantly aluminum (e.g., $AlO_x$), a metal oxide comprising predominantly magnesium (e.g., MgO), a metal oxide comprising predominantly lanthanum (e.g., $LaO_x$), a metal oxide comprising predominantly hafnium (e.g., $HfO_x$). Some specific examples of other suitable high-k gate dielectric materials include lanthanum aluminum oxide, zirconium oxide, zirconium silicon oxide, tantalum oxide, titanium oxide, barium strontium titanium oxide, barium titanium oxide, strontium titanium oxide, yttrium oxide, lead scandium tantalum oxide, and lead zinc niobate.

As further shown in FIG. 2B, double-sided cell structures 100 are two laterally adjacent cell structures within a single row of memory array 201 that is coincident with the A-A' line shown in FIG. 2B. The footprint, or area, of double-sided cell 100 is outlined with a dashed line box, and is substantially equal to the area of frontside bit cell 10. Frontside capacitor 171 is illustrated in the plan view as slightly behind the A-A' line so that the sectional view in FIG. 2A only shows a single capacitor plate. One frontside interconnect 245 (e.g., a wordline) is electrically coupled to all gate electrodes 110 of one row of double-sided cells. Between adjacent rows, gate electrodes 110 are electrically isolated by end spaces 210, which may be filled with any suitable dielectric material. Frontside capacitors 171 are similarly isolated between adjacent rows by end spaces 220 between frontside drain contacts 161. Because gate electrodes 110 are electrically contiguous within one double-sided cell, frontside interconnect 245 functions as a shared wordline for both frontside bit cell 10 and backside bit cell 20. Frontside interconnect 245 may directly contact gate electrodes 110 of a given row, or an intervening via 244 (illustrated in dashed outline) may couple a single gate electrode to frontside interconnect 245.

As further shown in FIG. 2B, another frontside interconnect 181 extends in a direction substantially orthogonal to frontside interconnect 245, and is electrically coupled to one of the pair of source and drain regions 106 of all frontside bit cells 10 within one column of array 201. Frontside interconnect 181 is therefore operable as a frontside bitline, and each frontside capacitor 171 may be accessed by appropriately biasing frontside interconnects 245 and 181. A second terminal of frontside capacitor 171 may be maintained at a reference potential (e.g., a ground plane voltage level) by another frontside interconnect (not depicted). Backside interconnect 182 may similarly extend in a direction substantially orthogonal to frontside interconnect 245 (e.g., just as illustrated for frontside interconnect 181), and is electrically coupled to one of the pair of source and drain regions 106 of all backside bit cells 20 within one column of array 201. Backside interconnect 182 is therefore similarly operable as a backside bitline. Hence, each backside capacitor 172 may be accessed by appropriately biasing frontside interconnect 245 and backside interconnect 182. The second terminal of backside capacitor 172 may be maintained at a reference potential (e.g., a ground plane voltage level) by another backside interconnect (not depicted). For the architecture illustrated in FIGS. 2A and 2B, memory array 201 can be characterized as an 8F2 bit cell size that is effectively reduced to a 4F2 cell size when divided by the two layers/sides of each cell structure 100 contained within the 8F2 footprint.

Figure 3A:
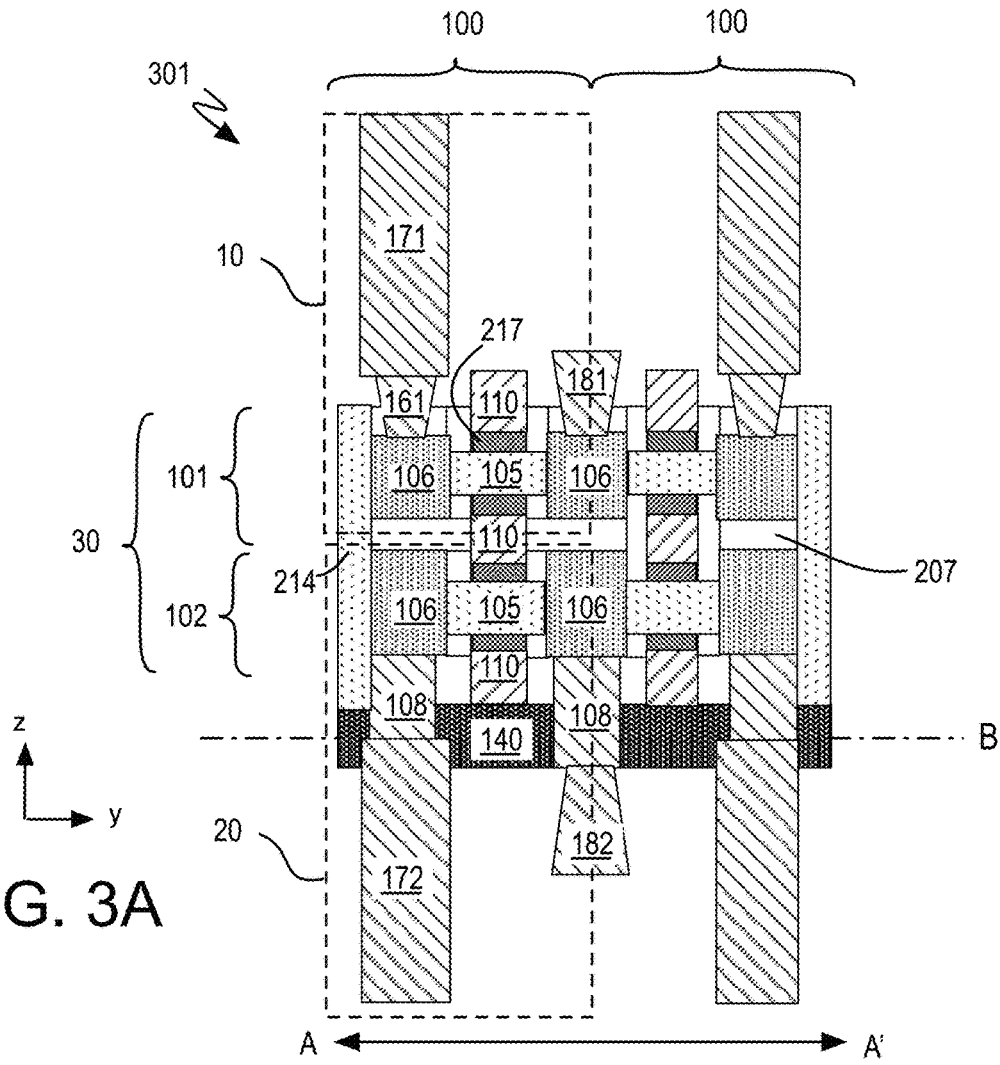
FIG. 3A illustrates a cross-sectional view of a memory array including double-sided DRAM cell structures, in accordance with some alternative embodiments.
Figure 3B:
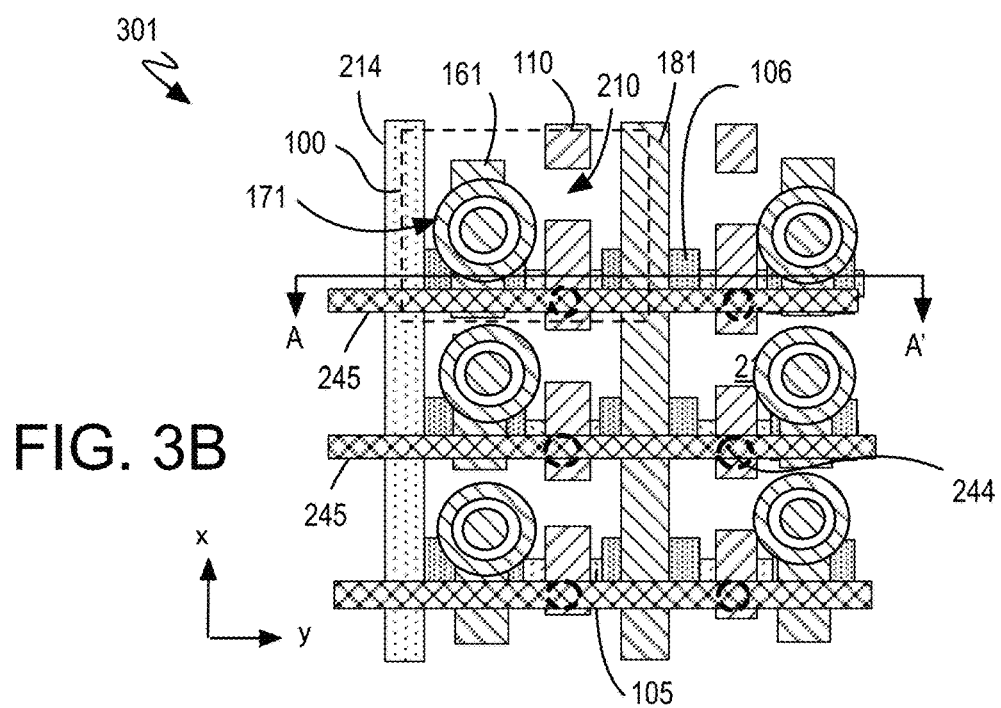
FIG. 3B illustrates a top-down plan view of the memory array shown in FIG. 3A, in accordance with some embodiments.

In some embodiments, a DRAM array employing double-sided cell structures has a shared-drain architecture, which can further reduce the bit cell size to 3F2. FIG. 3A illustrates a cross-sectional view of a memory array 301 that again includes double-sided DRAM cell structures 100, but in accordance with shared frontside and shared backside bitline embodiments. FIG. 3B illustrates a top-down plan view of the memory array 301. The views shown in FIGS. 3A and 3B are analogous to those of FIGS. 2A and 2B to best highlight architectural distinctions. For clarity, reference numbers previously introduced in reference to memory array 201 (FIG. 2A, 2B) are retained for features in memory array 301 that may have any of the same properties described in the context of those reference numbers.

For the exemplary embodiments, electrical isolation between source and drain stacks of pairs of adjacent cell structures 100 is eliminated such that one of the source and drain regions of upper transistors 101 in two adjacent pairs of cells are coupled to one "shared" frontside bitline 181. As further illustrated in FIG. 3A, one of the source and drain regions of lower transistors 201 in two adjacent pairs of cells are electrically coupled to one "shared" backside bitline 182. Aside from the 2:1 reduction in frontside and backside bitlines, the architecture of memory array 301 is substantially identical to that of memory array 201. For example, the stacked transistors 101 and 102 share a common gate electrode electrically coupled to frontside wordlines 245. Likewise, the second terminals of capacitors 171, 172 may again be coupled to a predetermined reference potential. The split frontside and backside bitlines, when so configured with a common gate electrode and frontside wordline, achieve a 3F2 bit cell size (6F2/2).

Figure 4A:
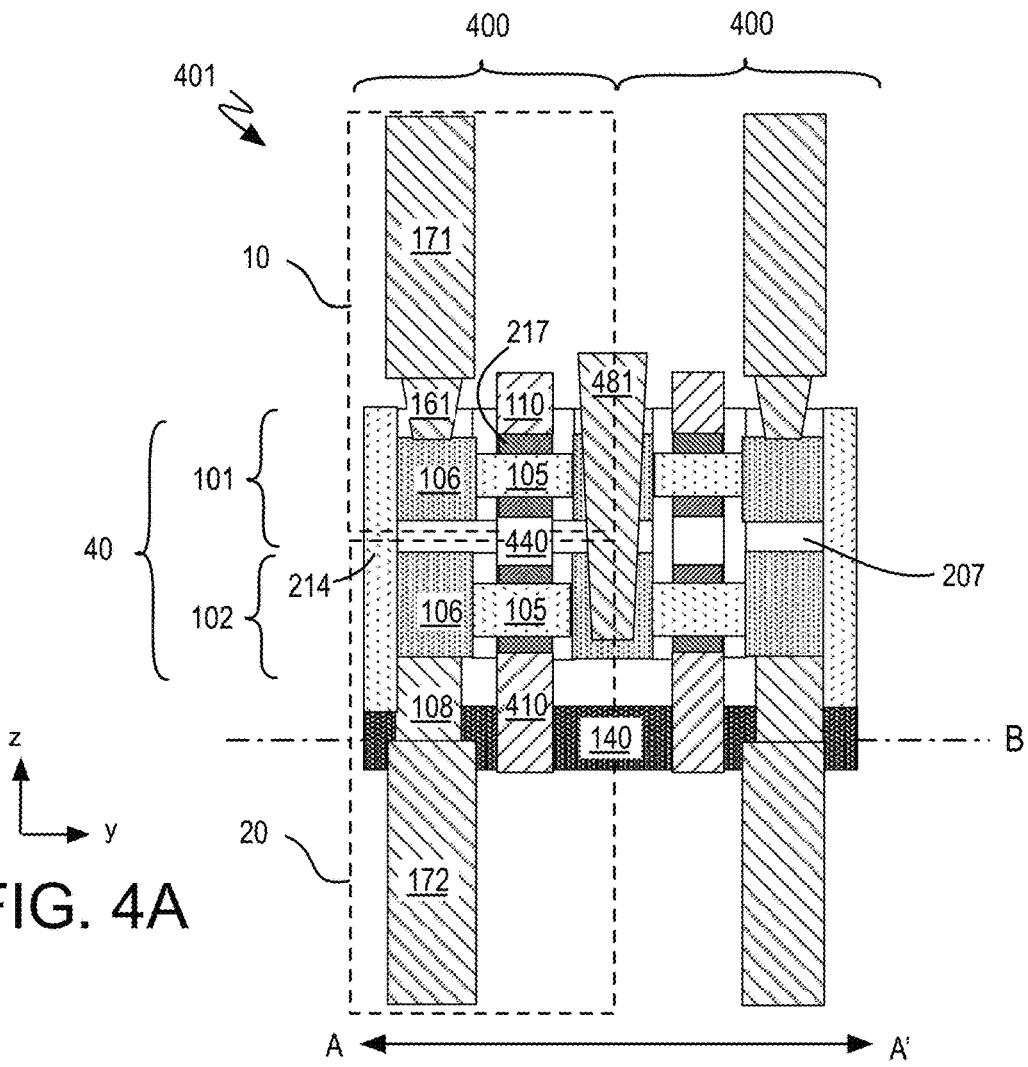
FIG. 4A illustrates a cross-sectional view of a memory array including double-sided DRAM cells, in accordance with some alternative embodiments.
Figure 4B:
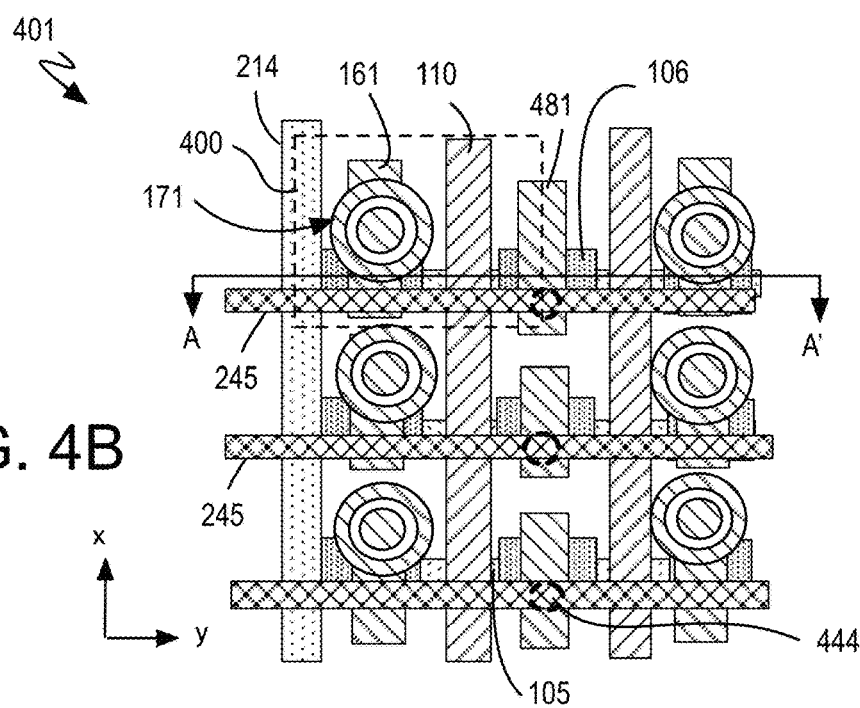
FIG. 4B illustrates a top-down plan view of the memory array shown in FIG. 4A, in accordance with some embodiments.

In some other embodiments, a DRAM array employing double-sided cell structures has one bitline shared between frontside and backside cells and a split gate architecture. FIG. 4A illustrates a cross-sectional view of a memory array 401 including double-sided DRAM cell structures 400, in accordance with some split gate embodiments. For clarity, reference numbers previously introduced in reference to memory array 201 (FIG. 2A, 2B) and/or 301 (FIG. 3A, 3B) are retained for features in memory array 401 that may have any of the same properties described in the context of those reference numbers. FIG. 4B illustrates a top-down plan view of the memory array 401, in accordance with some split gate embodiments.

As shown in FIG. 4A, frontside bit cell 10 again includes upper transistor 101 and backside bit cell 20 includes lower transistor 102. However, upper transistor 101 and lower transistor 102 do not share a common gate electrode so that stacked transistor structure 40 incudes a first (upper) gate electrode 110 over a second (lower) gate electrode 410, which are spaced apart, and electrically isolated, by a dielectric material 440. Adjacent pairs of double-sided DRAM cell structures 400 within a single row of array 401 share a common frontside bitline contact 481.

As shown in FIG. 4B, frontside interconnect 245 is thus operable as a bitline electrically coupled to all bitline contacts 481 within one row of array 401. In this embodiment, frontside bitline contact 481 is electrically coupled (e.g., in direct contact with) both one upper source and drain region 106, and one lower source and drain region 106 of two adjacent cell structures 400 that are in the same row. Hence, frontside interconnect 245 is operable as a common bitline to both frontside bit cell 10 and backside bit cell 20.

As further shown in FIG. 4B, upper gate electrode 110 is a continuous frontside wordline extending orthogonal to frontside interconnect 245, over one column of array 401. With split gate electrodes, lower gate electrodes 410 may similarly electrically couple together one column of backside bit cells. Although not visible in FIG. 4B. the backside wordline may have substantially the same layout illustrated for upper gate electrode 110. The backside wordline, for example, may extend in a direction perpendicular to frontside (bitline) interconnect 245. Frontside capacitor 171 is again coupled to the other upper source and drain region 106, and backside capacitor 172 is coupled to the other lower source and drain region 106.

In memory array 401, each frontside capacitor 171 may be accessed by appropriately biasing frontside interconnect 245 and gate electrodes 110 (as a continuous frontside wordline). Each backside capacitor 172 may be similarly accessed by appropriately biasing frontside interconnect 245 and gate electrodes 410 (as a continuous backside wordline). Second terminals of capacitors 171 and 172 may again be held any one common reference potential, for example so that charges in the capacitors are modulated independently through wordline and bitline addressing.

Figure 5A:
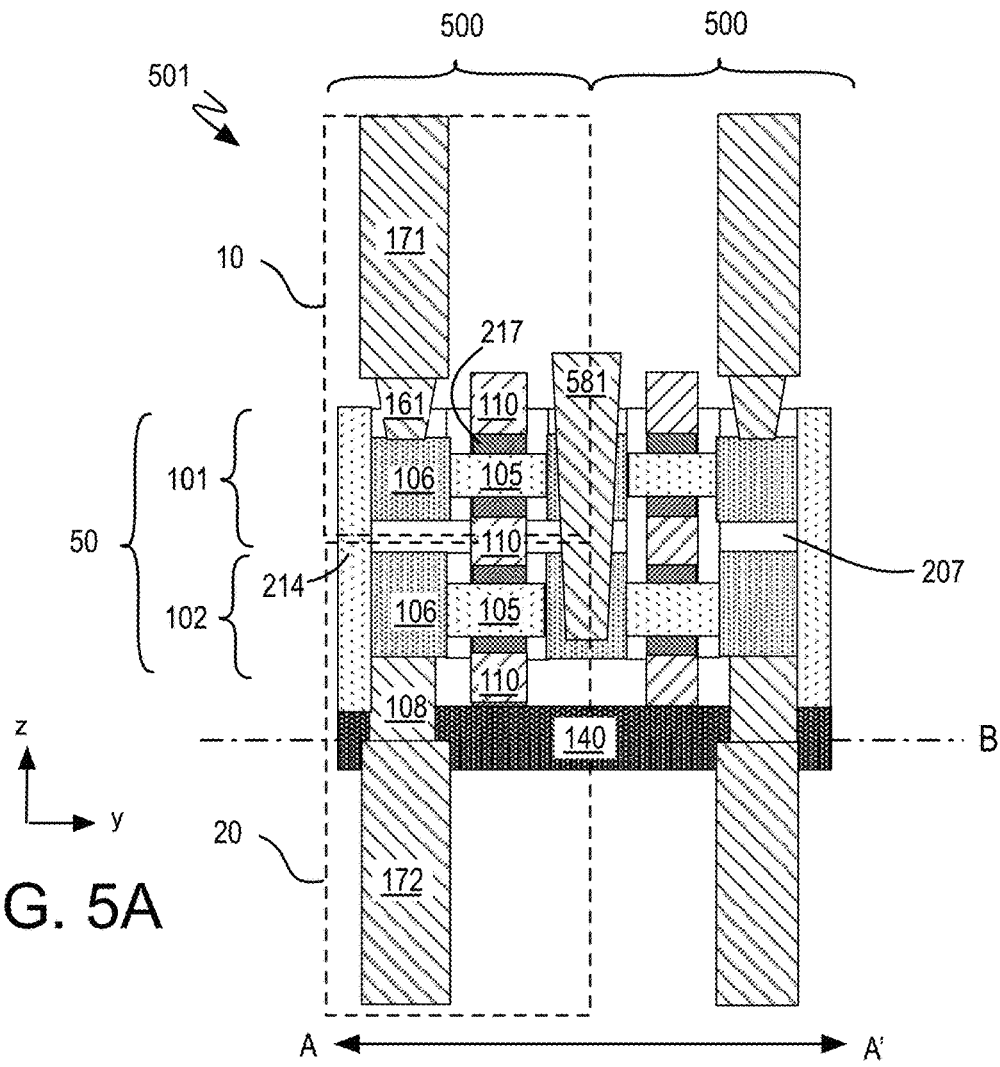
FIG. 5A illustrates a cross-sectional view of a memory array including double-sided DRAM cells, in accordance with some alternative embodiments.
Figure 5B:
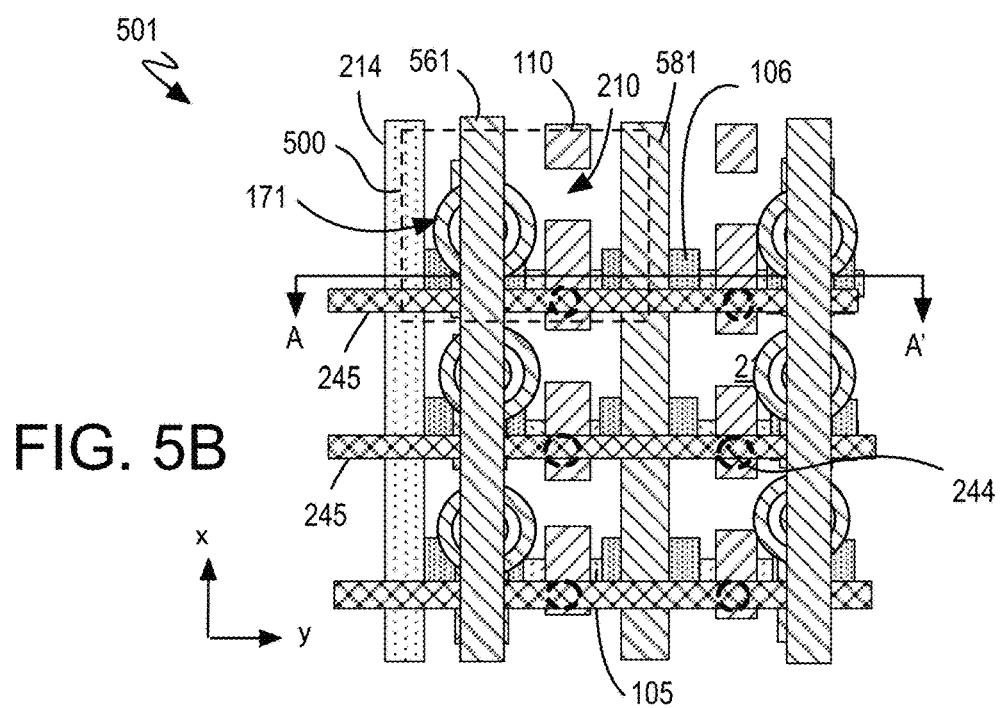
FIG. 5B illustrates a top-down plan view of the memory array shown in FIG. 5A, in accordance with some embodiments.

In other embodiments, capacitor terminals are not grounded and instead each frontside and backside capacitor have two independent terminals. FIG. 5A illustrates a cross-sectional view of a memory array 501 including double-sided DRAM cells 500, in accordance with some alternative embodiments with a shared gate, shared bitline and independent capacitor terminals. FIG. 5B illustrates a top-down plan view of the memory array 501, in accordance with some embodiments.

As shown in FIG. 5A, double-side cells 500 include the transistor stack structure 50, which has a common gate electrode 110 around the stacked channels 105. With the gate electrode in common, frontside interconnect 245 (FIG. 5B) is again operable within memory array 501 as a wordline for addressing both frontside bit cell 10 and backside bit cell 20. In contrast to transistor stack structure 30 (e.g., FIG. 3A, 3B), transistor stack structure 50 has one of the pairs of source and drain regions 106 electrically tied together by a frontside interconnect 581 that extends in a direction substantially orthogonal to frontside interconnect 245 and is continuous along a column of memory array 501. In this architecture, frontside interconnect 581 is operable as a shared bitline for addressing both frontside bit cell 10 and backside bit cell 20 for a pair of adjacent double-sided cells 50 of one row in array 501. With both gate electrode 110 and one of the pairs of source and drain regions 106 electrically tied together, independent charge/discharge of frontside capacitor 171 relies upon a third frontside interconnect 561 (FIG. 5B). In this example, frontside interconnect 561 extends in the column direction (perpendicular to interconnect 245) and is electrically coupled to the second terminal of each frontside capacitor 171 of one column of cells 500 within array 501. Although not visible in FIG. 5B, array 501 further includes a backside interconnect electrically coupled to the second terminal of each backside capacitor 172 of one column (or row) of cells 500 within array 501 substantially as illustrated for frontside interconnect 561. During operation of memory array 501, frontside interconnect 561 of a selected column may be appropriately biased (not grounded) in concert with the shared (wordline) interconnect 245 and shared (bitline) interconnect 581. An analogous backside interconnect of a selected column may be likewise biased (not grounded) in concert with the shared (wordline) interconnect 245 and shared (bitline) interconnect 581.

The above description provides only some of the memory layout/architectural options available to double-sided DRAM cells comprising front and back capacitors coupled to a stacked transistor structure. The above examples are therefore only illustrative. As the above architectures share a number of structural attributes, fabrication need only deviate slightly for each exemplary embodiment, for example to split or share various terminal contacts and/or frontside/backside interconnects.

Figure 6:
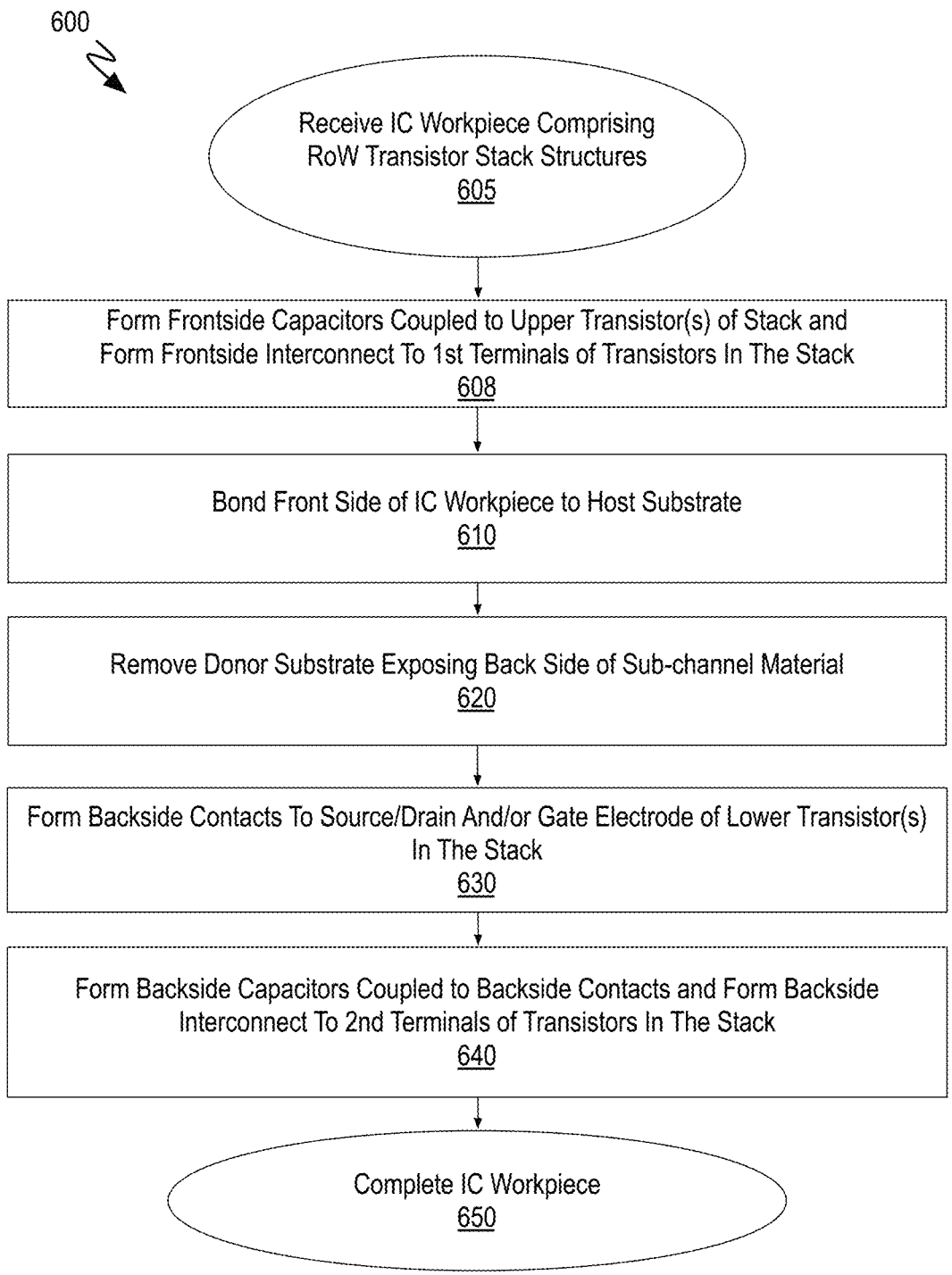
FIG. 6 is a flow diagram illustrating methods of fabricating the double-sided DRAM cells shown in FIG. 2A, in accordance with some embodiments.
Figure 7A:
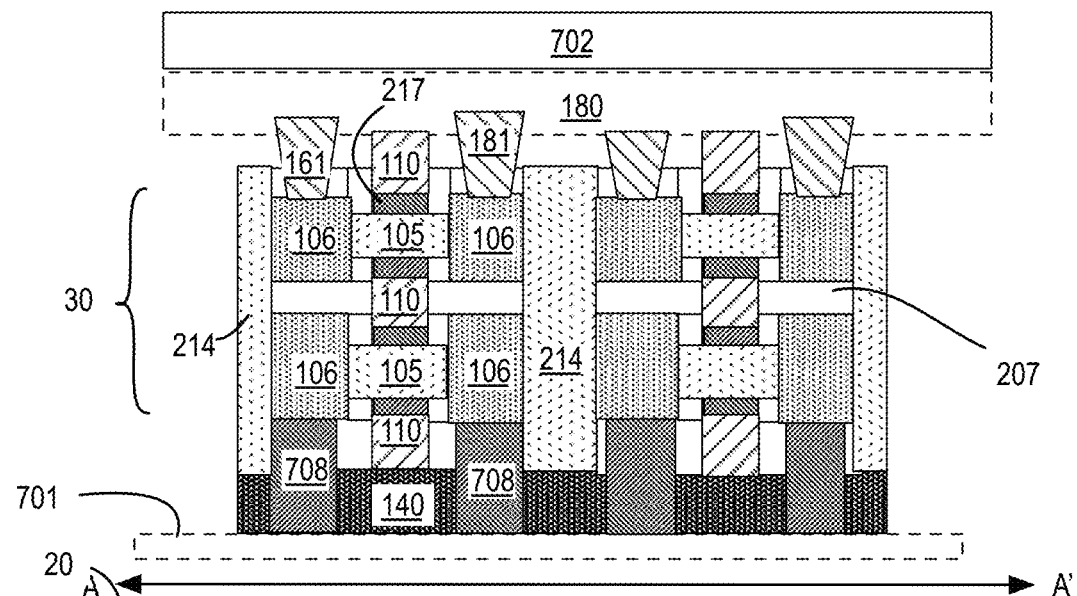
FIGS. 7A, 7B, and 7C illustrate cross-sectional views of double-sided DRAM cells evolving as the methods illustrated in FIG. 6 are practiced, in accordance with some embodiments.
Figure 7B:
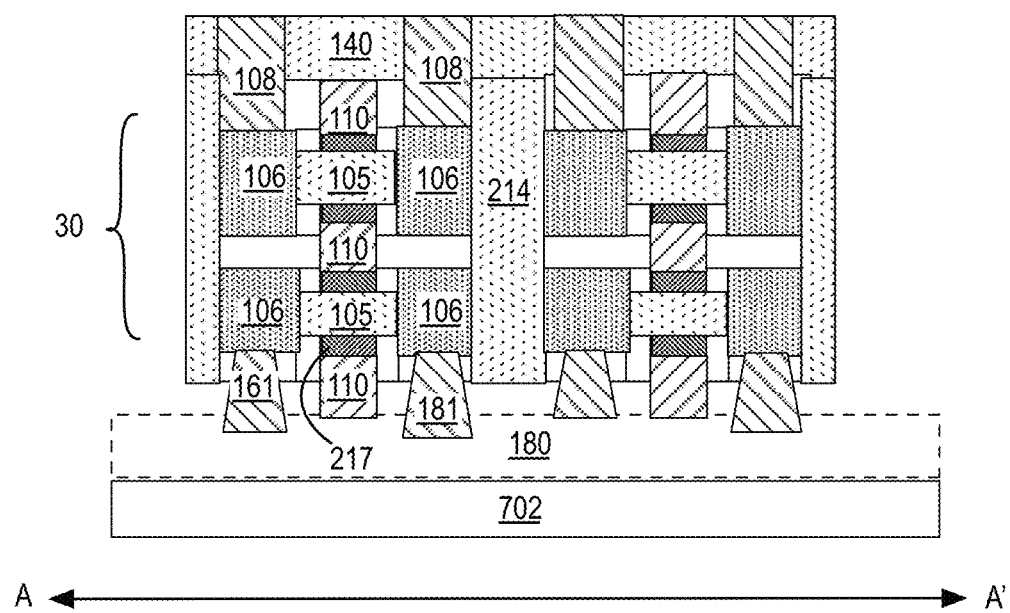
Figure 7C:
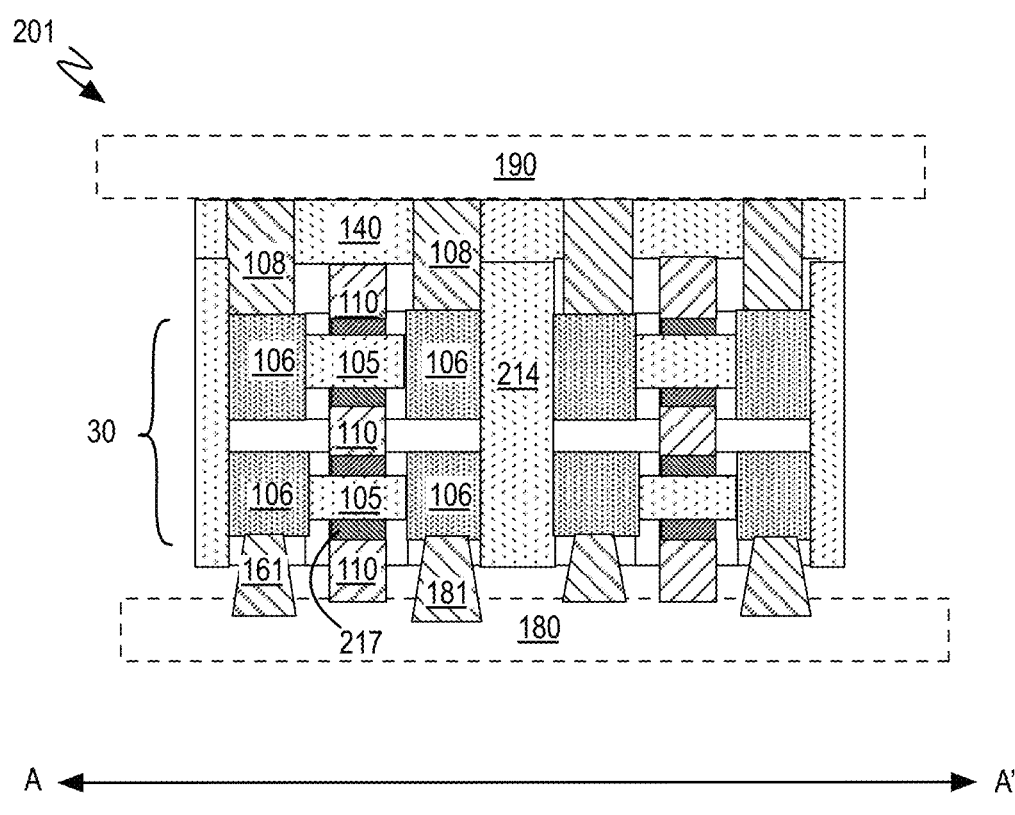

FIG. 6 is a flow diagram illustrating methods 600 for fabricating the double-sided DRAM cells 100, in accordance with some embodiments. FIG. 7A-7C illustrate cross-sectional views of double-sided DRAM cells 100 evolving as methods 600 are practiced, in accordance with some embodiments.

Methods 600 begin at input 605 where an IC workpiece comprising RoW transistor stack structures is received. This input may be fabricated upstream of methods 600, for example according to techniques employed in the fabrication of logic devices. As such, preparation of transistor stack structures suitable for input 605 is only briefly outlined below. However, the interested reader is referred to the patent literature, for example one or more commonly assigned applications directed at stacked complementary metal oxide semiconductor (CMOS) field effect transistors (FET).

Fabrication of a RoW transistor stack structure may begin with forming a transistor channel material stack including a sacrificial material layer between channel material layers over an area of substrate, such as a semiconductor wafer, that is eventually to be singulated into IC chips. In some embodiments, the sacrificial material layers include more germanium than the channel material. For example, where the channel material is predominantly silicon, sacrificial layers are $Si_{1-x}Ge_X$, where X is between 0.1-0.5. In some further embodiments, the thickness of the sacrificial layers may vary for different sacrificial layers. For example, a sacrificial layer between two channel material layers that are to be electrically isolated from each other as channels of independent transistors may be thicker than a sacrificial layer between two channel material layers that are to be operable as a single transistor.

The transistor channel material stack is patterned into a fin. Any patterning process such, as but not limited to, a spacer-based lithographic pitch-reduction patterning process may be practiced. Any subtractive etch may be practiced to delineate features (e.g., fins) into the channel material stack. In some embodiments, a plasma etch process may be utilized to define features.

At least a portion of the fin may then be protected with a channel mask. The channel mask may include one or more material layers. Prior to forming the channel mask, a dielectric material may be deposited over the fin of stacked channel materials, and on sidewalls of the fin. The dielectric may then be planarized so a top surface of the dielectric material is substantially coplanar with a top surface of the fin. The planar dielectric material may be recessed to a level at, or below, one or more of the channel materials in the stack. In some embodiments, the channel mask formed over exposed portions of the fin includes a sacrificial gate stack, for example further including a dielectric layer such as silicon oxide, or $Al_2O_3$, and any other material, such as, but not limited to polysilicon. Optionally, a spacer dielectric may be deposited over the channel mask and anisotropically etched to form a spacer around the channel mask.

Source and drain regions may then be formed adjacent to the channel mask and/or spacer dielectric. The formation of source and drain regions may include the removal of at least the sacrificial material layers between the channel materials, and may further include removal of the channel material as well. A portion of the underlying substrate (e.g., silicon) may also be etched, for example forming deep recesses adjacent to the sub-channel region. Any such deep recesses may be backfilled with a sacrificial material, for example as described in International Application PCT/US2015/052033, commonly assigned. Source and drain material may be deposited or epitaxially grown in contact with the channel material layers of the fin. In some embodiments, the source and drain regions are epitaxially grown by a low pressure CVD (LPCVD) process. In exemplary embodiments, predominantly silicon, and one or more n-dopants such as phosphorus, arsenic, or antimony, are grown as separate crystals with the growth process terminated before stacked the source and drain material merge together. Within the remaining space, an amorphous material (e.g., dielectric) may be deposited to electrically isolate the upper and lower pairs of source and drain regions.

The channel mask may then be removed and sacrificial material stripped from between channel regions of the exposed stack of channel materials. In some embodiments, a wet chemical etch process is utilized to remove the sacrificial layers selectively from intervening channel materials to expose the channel material as ribbon or wires (RoW). Following the exposure of RoW channel regions, methods 401 may continue with the deposition of gate dielectric material and one or more gate electrodes. Deposition of the gate electrode may completely fill in the space where the sacrificial material layer was removed from between two channel regions, for example to provide a common gate electrode around multiple channel regions. Or, deposition of the gate electrode may not completely fill in the space where the sacrificial material layer was removed from between two channel regions, for example to space apart the gate electrodes around separate channel regions. Any space left after gate metal deposition may then be filled with a suitable dielectric for electrical isolation. Gate electrode formation may further include deposition of fill metal, such as, but not limited to, W. Deposition of the fill metal may be by ALD or CVD, for example. The transistor stack structures then are substantially ready as inputs to methods 600.

Methods 600 continue at bock 608 where frontside interconnect metallization is fabricated over the transistor stack structures. At bock 608, frontside interconnect metallization may be fabricated according to any damascene or subtractive processing techniques suitable for forming frontside MIM capacitors and frontside memory array interconnects (e.g., wordlines and/or bitlines and/or capacitor lines).

At bock 610, the frontside of the IC workpiece is bonded to a host substrate. At block 620, the donor substrate is removed to expose a backside of sub-channel material below the stacked transistor structures. Once exposed, backside contacts are fabricated to at least a lower pair of source and drain regions of a transistor in the stacked transistor structure at bock 630. At bock 640, backside interconnect metallization may be fabricated according to any damascene or subtractive processing techniques suitable for fabricating backside MIM capacitors and backside memory array interconnects (e.g., wordlines and/or bitlines and/or capacitor lines).

In the example further illustrated in FIG. 7A, transistor stack structures 30 are over a donor substrate 701 (e.g., first silicon wafer). As shown, stacked source and drain regions 106 are over a sacrificial material 708, which extends deeply into sub-channel region 140. In FIG. 7A, frontside metallization levels 180 are represented by a dashed line box for clarity, but includes frontside capacitors (e.g., 171 as illustrated in FIG. 1). A host substrate 702 (e.g., second silicon wafer) is shown bonded to a top surface of frontside metallization levels 180. As further shown in FIG. 7B, the assembly is inverted, donor substrate 701 removed and sacrificial material 708 replaced with backside source/drain contact 108. FIG. 7C illustrates memory array 201 following fabrication of backside metallization levels 190, which are illustrated as a dashed line box for clarity, but includes backside capacitors (e.g., 172 as illustrated in FIG. 1). Although no host substrate 702 is depicted in FIG. 7C, a host substrate may be retained within a final IC, or may be removed during an assembly of memory array 201 into a 3D stacked, multi-tiered memory device.

Figure 8:
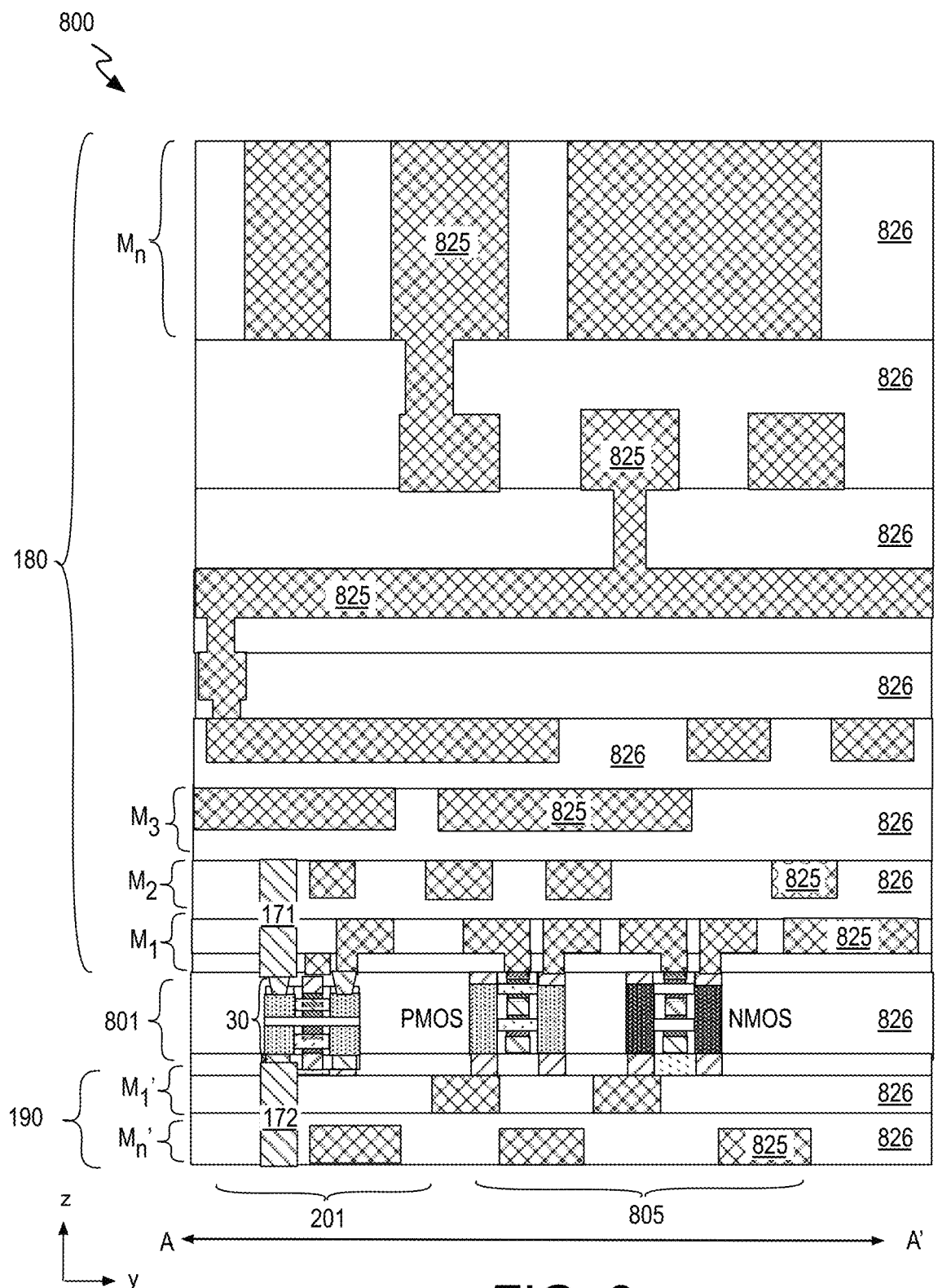
FIG. 8 is a cross-sectional view of a double-sided 3D IC structure, in accordance with some embodiments.

FIG. 8 is a cross-sectional view of a double-sided 3D IC structure 800, in accordance with some embodiments. The cross-sectional view in FIG. 8 is along the A-A' line introduced above and illustrates an example where a double-sided DRAM memory array is embedded within CMOS logic circuitry. In this example, a device layer 801 includes double-sided DRAM array 201, as well as logic circuitry 805 comprising PMOS and NMOS RoW stacked transistor structures.

Double-sided IC structure 800 includes frontside interconnect metallization levels 180 including frontside capacitors 171, for example substantially as described above. Double-sided IC structure 800 includes backside interconnect metallization levels 190 including backside capacitors 172, for example substantially as described above. Frontside interconnect metallization levels 180 include interconnect metallization 825 electrically insulated by dielectric material 826. In the exemplary embodiment illustrated, frontside interconnect metallization levels 180 includes metal-one ($M_1$), metal-two ($M_2$), metal-three ($M_3$) and metal-n ($M_n$) interconnect metallization levels. Interconnect metallization 825 may be any metal(s) suitable for IC interconnection. Interconnect metallization 825, may be, for example, an alloy of predominantly Cu, an alloy of predominantly W, an alloy of predominantly Ru, an alloy of predominantly Al, an alloy of predominantly Mo, etc. Dielectric material 826 may be any dielectric material known to be suitable for electrical isolation of monolithic ICs. In some embodiments, dielectric material 826 comprises silicon, and at least one of oxygen and nitrogen. Dielectric material 826 may be SiO, SiN, or SiON, for example. Dielectric material 826 may also be a low-K dielectric material (e.g., having a dielectric constant below that of $SiO_2$).

Within interconnect metallization levels 190, interconnect metallization 825 is again electrically insulated by dielectric material 826. In addition to backside capacitors 172, backside metallization levels 190 may comprise any number of metallization levels over, or on, a back side of transistor stack structures 30. In the illustrated example, backside metallization a metallization levels 190 include a metallization level $M_1'$ nearest to transistor structures 30 (e.g., opposite $M_1$) through a uppermost backside metallization level $M_n'$.

Although IC structure 800 includes one device level 801, there may be multiple levels of transistor structures located within the various interconnect metallization levels, for example where a front-side metallization level of one IC structure has been bonded to a back-side metallization level of another IC structure to arrive at a composite 3DIC.

Figure 9:
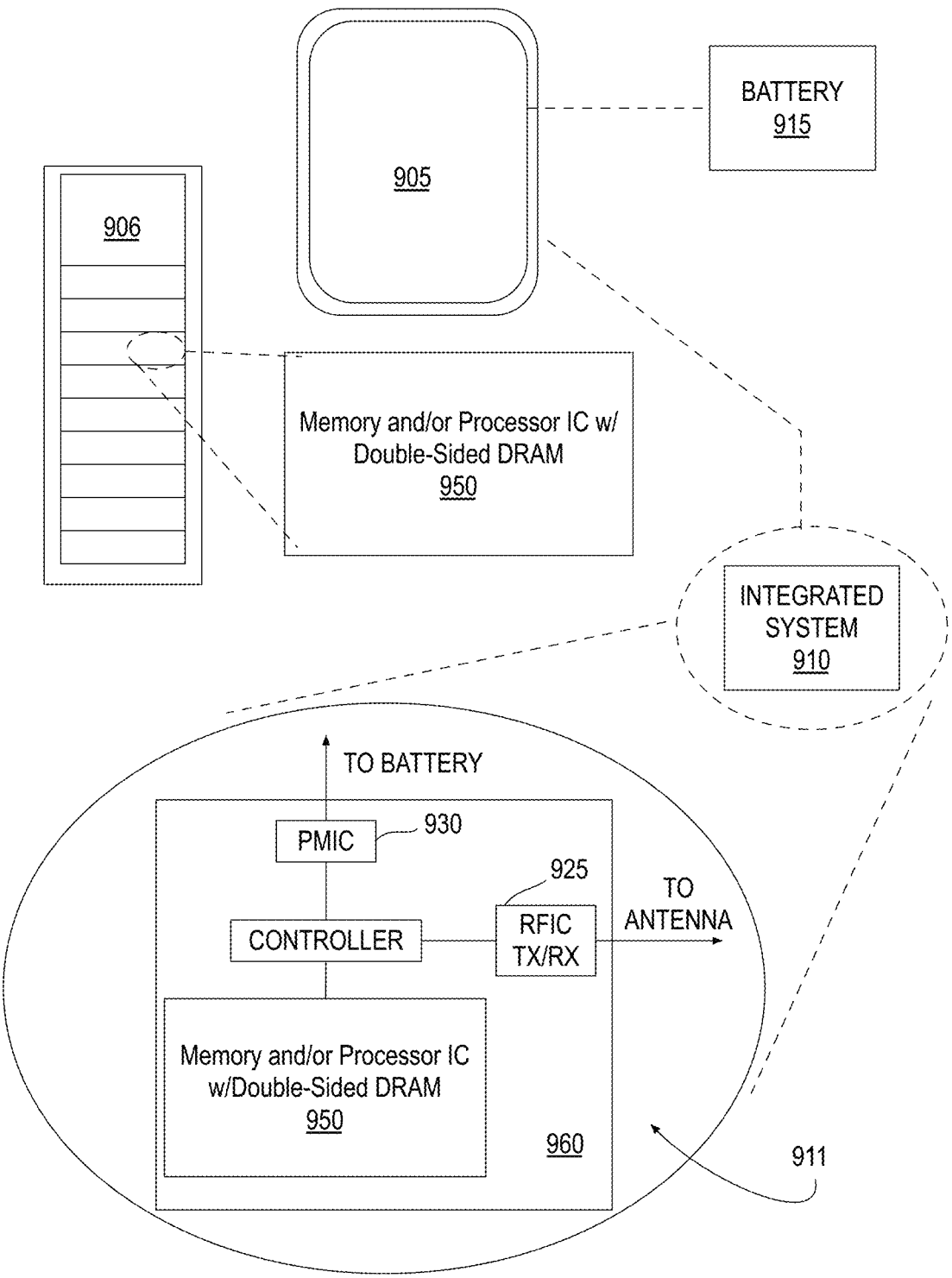
FIG. 9 illustrates a mobile computing platform and a data server machine employing an IC including doubled-sided DRAM cells, in accordance with embodiments.

The double-sided memory arrays described herein may be integrated into a wide variety of ICs and computing systems that include such ICs. FIG. 9 illustrates a system in which a mobile computing platform 905 and/or a data server machine 906 employs an IC having a memory and/or microprocessor IC with one or more double-sided 2D DRAM arrays including a transistor stack structure, for example in accordance with some embodiments described elsewhere herein. The server machine 906 may be any commercial server, for example including any number of high-performance computing platforms within a rack and networked together for electronic data processing, which in the exemplary embodiment includes a monolithic IC 950. The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), a chip-level integrated system 910, and a battery 915.

Whether disposed within the integrated system 910 illustrated in the expanded view 911, or as a stand-alone packaged chip within the server machine 906, IC 950 may include memory circuitry (e.g., DRAM), and/or a logic circuitry (e.g., a microprocessor, a multi-core microprocessor, graphics processor, or the like). At least one of these circuitries further includes with one or more double-sided 2D DRAM arrays including a transistor stack structure, for example in accordance with some embodiments described elsewhere herein. IC 950 may be further coupled to a board or package substrate 960 that further hosts one or more additional ICs, such as power management IC 930 and radio frequency IC 925. RFIC 925 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 10:
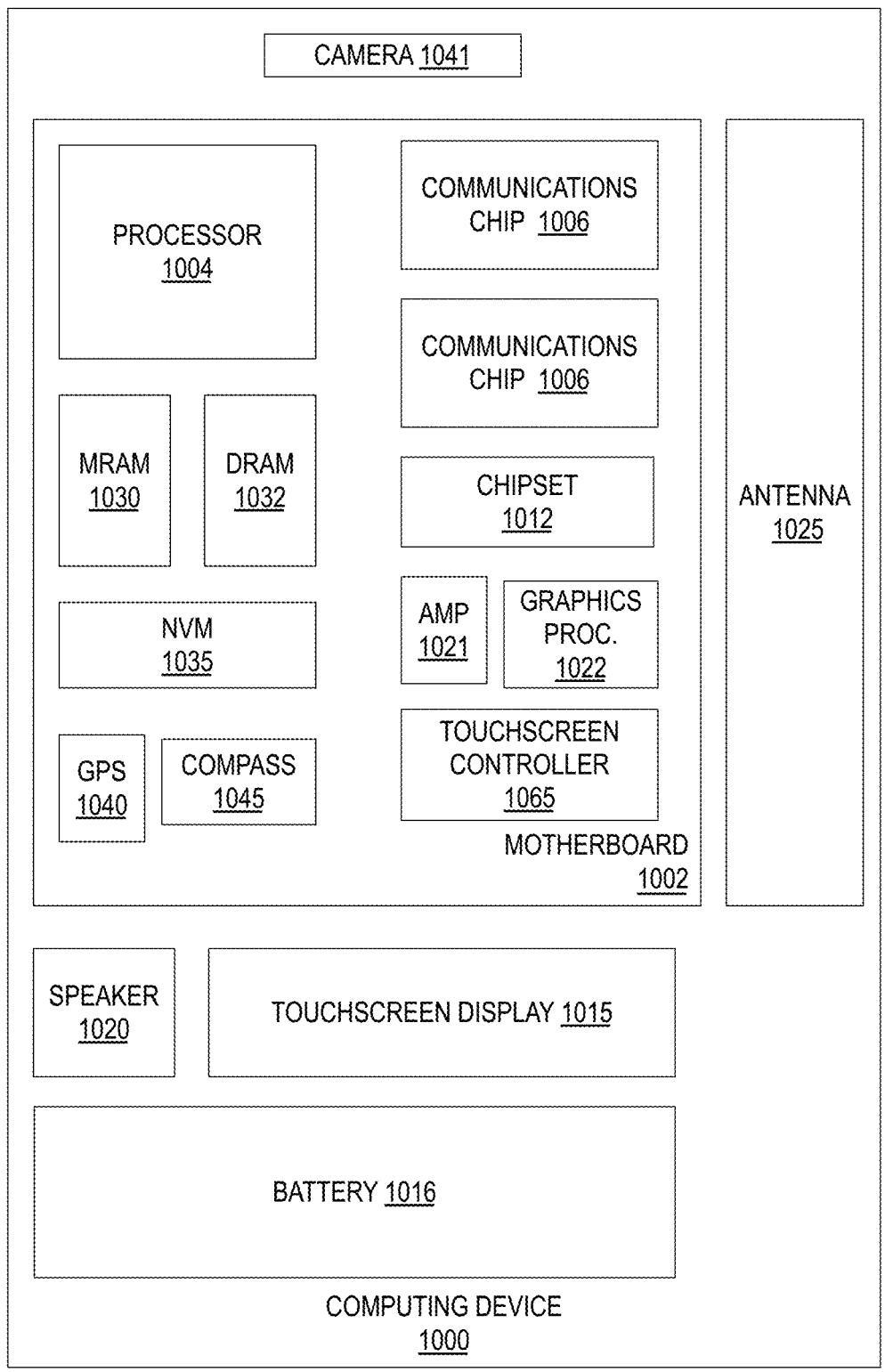
FIG. 10 is a functional block diagram of an electronic computing device, in accordance with some embodiments.

FIG. 10 is a functional block diagram of an electronic computing device 1000, in accordance with some embodiments. Device 1000 further includes a motherboard 1002 hosting a number of components, such as, but not limited to, a processor 1004 (e.g., an applications processor). Processor 1004 may be physically and/or electrically coupled to motherboard 1001. In some examples, processor 1004 is part of an IC including one or more double-sided 2D DRAM arrays including a transistor stack structure, for example in accordance with some embodiments described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1006 may also be physically and/or electrically coupled to the motherboard 1002. In further implementations, communication chips 1006 may be part of processor 1004. Depending on its applications, computing device 1000 may include other components that may or may not be physically and electrically coupled to motherboard 1002. These other components include, but are not limited to, volatile memory (e.g., DRAM 1032), non-volatile memory 1035, flash memory (e.g., NAND or NOR), magnetic memory 1030, a graphics processor 1022, a digital signal processor, a crypto processor, a chipset 1012, an antenna 1025, touchscreen display 1015, touchscreen controller 1065, battery 1016, audio codec, video codec, power amplifier 1021, global positioning system (GPS) device 1040, compass 1045, accelerometer, gyroscope, speaker 1020, camera 1041, and mass storage device (such as hard disk drive, solid-state drive (SSD), compact disk (CD), digital versatile disk (DVD), and so forth, or the like.

Communication chips 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1006 may implement any of a number of wireless standards or protocols, including, but not limited to, those described elsewhere herein. As discussed, computing device 1000 may include a plurality of communication chips 1006. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that embodiments are not limited to only the exemplary embodiments described above, but can be practiced with modification and alteration without departing from the scope of the appended claims. For example the above embodiments may include specific combinations of features as further provided below.

In first examples, integrated circuit (IC) comprises a two-dimensional (2D) array of double-sided memory cells. Individual ones of the memory cells comprise a stacked field effect transistor structure, comprising a stack of channel regions comprising a semiconductor material, one or more gate electrodes around the stack of channel regions, and a stack of source and drain regions comprising a first pair of source and drain regions electrically coupled to a first of the channel regions and over a second pair of source and drain regions electrically coupled to a second of the channel regions. The memory cells comprise a first capacitor comprising a metal-insulator-metal (MIM) structure on a first side of the stacked transistor structure. The first capacitor comprises a first terminal that is electrically coupled to a first of the first pair of source and drain regions. The memory cells comprise a second capacitor comprising a MIM structure on a second side of the stacked transistor structure, opposite the first side. The second capacitor comprises a terminal that is electrically coupled to a first of the second pair of source and drain regions.

In second examples, for any of the first examples the first pair of source and drain regions is spaced apart from the second pair of source and drain regions by an intervening dielectric material.

In third examples, for any of the second examples the IC comprises a first interconnect extending in a first direction on a first side of a row of the memory cells, wherein the first interconnect is electrically coupled to at least one of the gate electrodes in each memory cell of the row. The IC comprises a second interconnect extending in a second direction, substantially orthogonal to the first direction, on the first side of one column of the memory cells. The second interconnect is coupled to a second of the first pair of source and drain regions in each memory cell of the column, and a third interconnect on a second side of the memory cells, opposite the first side. The third interconnect is coupled to one of a second of the second pair of source and drain regions in each memory cell of the row or column, a second of the gate electrodes in each memory cell of the row or column, or a second terminal of the second capacitor in each memory cell of the row or column In fourth examples for any of the third examples a first of the gate electrodes is around the first of the channel regions, a second of the gate electrodes is around the second of the channel regions, the first of the gate electrodes is in contact with a second of the gate electrodes, second of the gate electrodes is electrically coupled to the first interconnect through only the first of the gate electrodes, and the third interconnect is coupled to the second of the second pair of source and drain regions in each memory cell of the column.

In fifth examples, for any of the fourth examples the second interconnect is split between two adjacent columns of the memory array, and the second interconnect is coupled to the second of the first pair of source and drain regions in a first memory cell, and is also coupled to a second of a first pair of source and drain regions of an adjacent memory cell within the row.

In sixth examples, for any of the fifth examples the third interconnect is split between the two adjacent columns of the memory array, the third interconnect is coupled to the second of the second pair of source and drain regions in the first memory cell, and is also coupled to a second of a second pair of source and drain regions in the adjacent memory cell within the row.

In seventh examples, for any of the third example a first of the gate electrodes is around the first of the channel regions, a second of the gate electrodes is around the second of the channel region. The first of the gate electrodes is spaced apart from the second of the gate electrodes by an intervening dielectric material. The second interconnect is coupled to the second of both the first and second pairs of source and drain regions in each memory cell of the column. The third of the interconnects is coupled to the second of the gate electrodes.

In eighth examples, for any of the third examples a first of the gate electrodes is around the first of the channel regions, a second of the gate electrodes is around the second of the channel regions, the first of the gate electrodes is in contact with a second of the gate electrodes, and the second of the gate electrodes is electrically coupled to the first interconnect through only the first of the gate electrodes. The second interconnect is coupled to the second of both the first and second pairs of source and drain regions in each memory cell of the column. The third interconnect is coupled to the second terminal of the second capacitor in the row or the column.

In ninth examples, for any of the eighth examples the second interconnect is split between two adjacent columns of the memory cell array, with the second interconnect coupled to the second of the first pair of source and drain regions in a first memory cell, and also coupled to a second of a first pair of source and drain regions of an adjacent memory cell within the row. The IC is further comprising a fourth interconnect on the first side of the memory cell array, wherein the fourth interconnect is coupled to a second terminal of the first capacitor in the row or the column.

In tenth examples, for any of the first through ninth examples the insulator of the MIM stacks comprises a ferroelectric or a dielectric, the channel regions are monocyrstalline semiconductor material comprising at least one of silicon or germanium, and the source and drain regions comprise at least one of silicon or germanium and an n-type impurity.

In eleventh examples, for any of the first through tenth examples, the IC further comprises logic circuitry electrically coupled to the memory array, wherein the logic circuitry comprises a plurality of p-type and n-type field effect transistor stack structures within a same plane as the stacked field effect transistor structure of each of the memory cells.

In twelfth examples, a computer system, comprises a power supply, and an IC die coupled to the power supply. The IC die comprises a two-dimensional (2D) array of double-sided memory cells. Individual ones of the memory cells comprise a stacked field effect transistor structure, comprising a stack of channel regions comprising a semiconductor material, one or more gate electrodes around the stack of channel regions, and a stack of source and drain regions comprising a first pair of source and drain regions electrically coupled to a first of the channel regions and over a second pair of source and drain regions electrically coupled to a second of the channel regions. The memory cells comprise a first capacitor comprising a metal-insulator-metal (MIM) structure on a first side of the stacked transistor structure. The first capacitor comprises a first terminal that is electrically coupled to a first of the first pair of source and drain regions. The memory cells comprise a second capacitor comprising a MIM stack on a second side of the stacked transistor structure, opposite the first side, wherein the second capacitor comprises a terminal that is electrically coupled to a first of the second pair of source and drain regions.

In thirteenth examples, for any of the twelfth examples the first pair of source and drain regions is spaced apart from the second pair of source and drain regions by an intervening dielectric material. The IC further comprises a first interconnect extending in a first direction on a first side of a row of the memory cells. The first interconnect is electrically coupled to at least one of the gate electrodes in each memory cell of the row. The IC further comprises a second interconnect extending in a second direction, substantially orthogonal to the first direction, on the first side of one column of the memory cells. The second interconnect is coupled to a second of the first pair of source and drain regions in each memory cell of the column The IC further comprises a third interconnect on a second side of the memory cells, opposite the first side. The third interconnect is coupled to one of a second of the second pair of source and drain regions in each memory cell of the row or column, a second of the gate electrodes in each memory cell of the row or column, or a second terminal of the second capacitor in each memory cell of the row or column In fourteenth examples, for any of the twelfth examples the system further comprises a battery coupled to the power supply.

In fifteenth examples, a method of fabricating an IC comprising a two-dimensional (2D) array of double-sided memory cells comprises receiving a workpiece comprising a transistor stack structure, forming frontside capacitors electrically coupled to an upper transistor of the stack structure, forming frontside interconnects to one or more first terminals the transistor stack structure, forming backside capacitors electrically coupled to a lower transistor of the stack structure, and forming backside interconnects to one or more second terminals of the transistor stack structure.

In sixteenth examples, for any of the fifteenth examples forming the backside interconnects further comprises forming backside contacts to at least one of a source, drain or gate of a lower transistor of the stack structure.

In seventeenth examples, for any of the sixteenth examples forming the frontside interconnects further comprises forming a first interconnect extending in a first direction on the front side of a row of the memory cells and electrically coupled to at least one of the gate electrodes in each memory cell of the row, forming a second interconnect extending in a second direction, substantially orthogonal to the first direction, on the front side of one column of the memory cells, and electrically coupled to a second of the first pair of source and drain regions in each memory cell of the column In eighteenth examples, for any of the seventeenth examples forming the backside interconnects further comprises forming a third interconnect on the backside of the memory cells and electrically coupled to at least one of a second of the second pair of source and drain regions in each memory cell of the row or column, a second of the gate electrodes in each memory cell of the row or column, or a second terminal of the second capacitor in each memory cell of the row or column.

In nineteenth examples for any of the fifteenth through eighteenth examples a first of the gate electrodes is around the first of the channel regions. A second of the gate electrodes is around the second of the channel regions. The first of the gate electrodes is in contact with a second of the gate electrodes. Forming the first interconnect comprises contacting the first of the gate electrodes. Forming the third interconnect comprising contacting the second of the second pair of source and drain regions in each memory cell of the column.

In twentieth examples, for any of the fifteenth examples the method comprises bonding the frontside to a host substrate after forming the frontside interconnects, and removing a donor substrate exposing the backside of transistor stack structure prior to forming the backside capacitors.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) comprising: an array of memory cells, wherein individual ones of the memory cells comprise:
   a stacked field effect transistor structure, comprising:
      a stack of channel regions comprising a semiconductor material;
      one or more gate electrodes around the stack of channel regions; and
      a stack of source and drain regions comprising a first pair of source and drain regions electrically coupled to a first of the channel regions, and over a second pair of source and drain regions electrically coupled to a second of the channel regions;
   a first capacitor comprising a metal-insulator-metal (MIM) structure on a first side of the stacked transistor structure, wherein the first capacitor comprises a first terminal that is electrically coupled to a first of the first pair of source and drain regions; and
   a second capacitor comprising a MIM structure on a second side of the stacked transistor structure, opposite the first side, wherein the second capacitor comprises a terminal that is electrically coupled to a first of the second pair of source and drain regions; and
   cell addressing interconnects coupled to each of the memory cells, wherein the cell addressing interconnects comprise:

an interconnect on the first side of the stacked transistor structure and electrically coupled to a terminal of the stacked transistor structure in two or more of the memory cells; and an interconnect on the second side of the stacked transistor structure and electrically coupled to a terminal of the stacked transistor structure or of the second capacitor in two or more of the memory cells.

2. The IC of claim 1, wherein the first pair of source and drain regions is spaced apart from the second pair of source and drain regions by an intervening dielectric material.

3. The IC of claim 1, wherein the cell addressing interconnects further comprise:
a first interconnect on the first side of the stacked transistor structure and extending in a first horizontal direction over a row of the memory cells, wherein the first interconnect is electrically coupled to at least one of the gate electrodes in each memory cell of the row of the memory cells;
a second interconnect on the first side of the stacked transistor structure and extending in a second horizontal direction, substantially orthogonal to the first direction, over a column of the memory cells, wherein the second interconnect is coupled to a second of the first pair of source and drain regions in each memory cell of the column; and
a third interconnect on the second side of the stacked transistor structure, wherein the third interconnect is coupled to one of:
a second of the second pair of source and drain regions in each memory cell of the row or the column;
a second one of the gate electrodes in each memory cell of the row or the column; or
a second terminal of the second capacitor in each memory cell of the row or the column.

4. The IC of claim 3, wherein:
a first of the gate electrodes is around the first of the channel regions;
a second of the gate electrodes is around the second of the channel regions;
the first of the gate electrodes is in contact with a second of the gate electrodes;
the second of the gate electrodes is electrically coupled to the first interconnect through only the first of the gate electrodes; and
the third interconnect is coupled to the second of the second pair of source and drain regions in each memory cell of the column.

5. The IC of claim 3, wherein the second interconnect is split between two adjacent columns of the memory array, and the second interconnect is coupled to the second of the first pair of source and drain regions in a first memory cell, and is also coupled to a second of a first pair of source and drain regions of an adjacent memory cell within the row.

6. The IC of claim 5, wherein the third interconnect is split between the two adjacent columns of the memory array, the third interconnect is coupled to the second of the second pair of source and drain regions in the first memory cell, and is also coupled to a second of a second pair of source and drain regions in the adjacent memory cell within the row.

7. The IC of claim 3, wherein:
a first of the gate electrodes is around the first of the channel regions;
a second of the gate electrodes is around the second of the channel regions;

the first of the gate electrodes is spaced apart from the second of the gate electrodes by an intervening dielectric material;
the second interconnect is coupled to the second of both the first and second pairs of source and drain regions in each memory cell of the column; and
the third of the interconnects is coupled to the second of the gate electrodes.

8. The IC of claim 3, wherein:
a first of the gate electrodes is around the first of the channel regions;
a second of the gate electrodes is around the second of the channel regions;
the first of the gate electrodes is in contact with a second of the gate electrode;
the second of the gate electrodes is electrically coupled to the first interconnect through only the first of the gate electrodes;
the second interconnect is coupled to the second of both the first and second pairs of source and drain regions in each memory cell of the column; and
the third interconnect is coupled to the second terminal of the second capacitor in the row or the column.

9. The IC of claim 3, wherein:
the second interconnect is split between two adjacent columns of the memory cell array, with the second interconnect coupled to the second of the first pair of source and drain regions in a first memory cell, and also coupled to a second of a first pair of source and drain regions of an adjacent memory cell within the row; and
further comprising a fourth interconnect on the first side of the memory cell array, wherein the fourth interconnect is coupled to a second terminal of the first capacitor in the row or the column.

10. The IC of claim 1, wherein:
the insulator of the MIM structures comprises a ferroelectric or a dielectric;
the channel regions are monocrystalline semiconductor material comprising at least one of silicon or germanium; and
the source and drain regions comprise at least one of silicon or germanium and an n-type impurity.

11. The IC of claim 1, further comprising logic circuitry electrically coupled to the memory array, wherein the logic circuitry comprises a plurality of p-type and n-type field effect transistor stack structures within a same plane as the stacked field effect transistor structure of each of the memory cells.

12. A computer system, comprising:
a power supply; and
an IC die coupled to the power supply, wherein the IC die comprises:
an array of memory cells, wherein individual ones of the memory cells comprise:
a stacked field effect transistor structure, comprising:
a stack of channel regions comprising a semiconductor material;
one or more gate electrodes around the stack of channel regions; and
a stack of source and drain regions comprising a first pair of source and drain regions electrically coupled to a first of the channel regions and over a second pair of source and drain regions electrically coupled to a second of the channel regions;
a first capacitor comprising a metal-insulator-metal (MIM) structure on a first side of the stacked transistor structure, wherein the first capacitor comprises a first terminal that is electrically coupled to a first of the first pair of source and drain regions; and a second capacitor comprising a MIM structure on a second side of the stacked transistor structure, opposite the first side, wherein the second capacitor comprises a terminal that is electrically coupled to a first of the second pair of source and drain regions.

13. The computer system of claim 12, wherein:

the first pair of source and drain regions is spaced apart from the second pair of source and drain regions by an intervening dielectric material; and further comprising:

a first interconnect extending in a first direction on a first side of a row of the memory cells, wherein the first interconnect is electrically coupled to at least one of the gate electrodes in each memory cell of the row;

a second interconnect extending in a second direction, substantially orthogonal to the first direction, on the first side of one column of the memory cells, wherein the second interconnect is coupled to a second of the first pair of source and drain regions in each memory cell of the column; and a third interconnect on a second side of the memory cells, opposite the first side, wherein the third interconnect is coupled to one of:

a second of the second pair of source and drain regions in each memory cell of the row or column;

a second of the gate electrodes in each memory cell of the row or column; or a second terminal of the second capacitor in each memory cell of the row or column.

14. The computer system of claim 12, further comprising a battery coupled to the power supply.

15. A method of fabricating an IC comprising an array of memory cells, the method comprising:

receiving a workpiece comprising a plurality of transistor stack structures, wherein individual ones of the transistor stack structures comprise:

a stack of channel regions comprising a semiconductor material;

one or more gate electrodes around the stack of channel regions; and a stack of source and drain regions comprising a first pair of source and drain regions electrically coupled to a first of the channel regions, and over a second pair of source and drain regions electrically coupled to a second of the channel regions;

forming a plurality of first capacitors on a first side of the transistor stack structures, wherein individual ones of the first capacitors are electrically coupled to a first of the first pair of source and drain regions in corresponding individual ones of the transistor stack structures;

forming, on the first side of the transistor stack structures, cell addressing interconnects to one or more first terminals of each of the transistor stack structures;

forming a plurality of second capacitors on a second side of the transistor stack structures, wherein individual ones of the second capacitors are electrically coupled to a first of the second pair of source and drain regions in corresponding individual ones of the transistor stack structures; and forming, on the second side of the transistor stack structures, cell addressing interconnects to one or more second terminals of each of the transistor stack structures.

16. The method of claim 15, wherein forming the cell addressing interconnects further comprises forming, on the second side, contacts to at least one of: a second of the second pair of source and drain regions; or the gate electrodes.

17. The method of claim 15, wherein forming the cell addressing interconnects further comprises:

forming a first interconnect extending horizontally in a first direction on the first side and electrically coupled to at least one of the gate electrodes in each memory cell of a row in the array;

forming a second interconnect extending horizontally in a second direction, substantially orthogonal to the first direction, on the first side, and electrically coupled to a second of the first pair of source and drain regions in each memory cell of a column in the array.

18. The method of claim 17, wherein forming the cell addressing interconnects further comprises forming a third interconnect on the second side, and electrically coupled to at least one of:

a second of the second pair of source and drain regions in each memory cell of the row or column;

a second of the gate electrodes in each memory cell of the row or column; or a second terminal of the second capacitor in each memory cell of the row or column.

19. The method of claim 18, wherein:

a first of the gate electrodes is around the first of the channel regions;

a second of the gate electrodes is around the second of the channel regions;

the first of the gate electrodes is in contact with a second of the gate electrodes;

forming the first interconnect comprises contacting the first of the gate electrodes; and forming the third interconnect comprising contacting the second of the second pair of source and drain regions in each memory cell of the column.

20. The method of claim 15, further comprising:

bonding the first side to a host substrate after forming at least some of the cell addressing interconnects; and removing a donor substrate exposing the second side of the transistor stack structure prior to forming the second capacitors.

* * * * *